United States Patent
Booth et al.

(10) Patent No.: US 8,416,884 B2
(45) Date of Patent: Apr. 9, 2013

(54) DIGITAL RF TRANSMITTER OPTIMIZED FOR LINEAR QUANTIZED IQ UP CONVERSION

(75) Inventors: Richard W. D. Booth, San Jose, CA (US); Gregoire Le Grand de Mercey, San Jose, CA (US)

(73) Assignee: Panasonic Corporation, Osaka (JP)

( * ) Notice: Subject to any disclaimer, the term of this patent is extended or adjusted under 35 U.S.C. 154(b) by 372 days.

(21) Appl. No.: 12/859,084

(22) Filed: Aug. 18, 2010

(65) Prior Publication Data

US 2012/0045020 A1    Feb. 23, 2012

(51) Int. Cl.
*H04L 27/36* (2006.01)
(52) U.S. Cl. .................. 375/298; 375/297
(58) Field of Classification Search .......... 375/295, 375/298, 300, 302, 303, 340, 269, 272, 308, 375/297; 455/102, 108, 205, 127.2, 127.3, 455/114.3; 330/10; 332/103, 144, 149
See application file for complete search history.

(56) References Cited

U.S. PATENT DOCUMENTS

| | | | |
|---|---|---|---|
| 5,612,651 A * | 3/1997 | Chethik | 332/103 |
| 2002/0079962 A1* | 6/2002 | Sander | 330/124 R |
| 2003/0054851 A1* | 3/2003 | Jo et al. | 455/522 |
| 2004/0166869 A1* | 8/2004 | Laroia et al. | 455/450 |
| 2009/0072921 A1* | 3/2009 | Schmid | 332/145 |
| 2011/0170624 A1* | 7/2011 | Goodman et al. | 375/295 |

* cited by examiner

*Primary Examiner* — Aristocratis Fotakis

(57) ABSTRACT

The digital RF transmitter includes a decoder for receiving the in phase (I) and quadrature (Q) digital baseband signals, a phase generator for generating eight waveforms at a carrier frequency where each phase is a multiple of 45 degrees, a first set of main amplifiers of fixed output power, a second set of auxiliary amplifiers of fixed output power such that the ratio of the voltage amplitudes at the outputs of the second set of auxiliary amplifiers to the voltage amplitudes at the outputs of the first set of main amplifiers is fixed at sqrt(2)−1, and a set of multiplexers for selecting one of the eight carrier waveforms, or an off signal, to transmit to each of the first set of main amplifiers and the second set of auxiliary amplifiers based on both the in phase (I) digital baseband signal and the quadrature (Q) digital baseband signal.

16 Claims, 5 Drawing Sheets

FIG. 2

| Signal | Value | Sign Bit | MSB | BIT 1 | LSB |
|---|---|---|---|---|---|
| I | −3 | 1 (−) | 0 | 1 | 1 |
| Q | +6 | 0 (+) | 1 | 1 | 0 |

FIG. 3

| Sign Bit I Signal | Sign Bit Q Signal | Quadrant | Phases (degrees) |
|---|---|---|---|
| 0 (+) | 0 (+) | I | 0, 45, 90 |
| 1 (−) | 0 (+) | II | 90, 135, 180 |
| 1 (−) | 1 (−) | III | 180, 225, 270 |
| 0 (+) | 1 (−) | IV | 270, 315, 0 |

| Bit | I | Q | $W_{m1} = 1$<br>$W_{m2} = 2$<br>$W_{m3} = 4$ | $W_{a1} = 1*(sqrt(2)-1)$<br>$W_{a2} = 2*(sqrt(2)-1)$<br>$W_{a3} = 4*(sqrt(2)-1)$ |
|---|---|---|---|---|
| Sign | − | + | 90°, 135° or 180° | 90°, 135° or 180° |
| MSB | 0 | 1 | $S5=W_{m3}*\cos(\omega_o t + 90°)$ | S6=OFF |
| Bit 1 | 1 | 1 | $S3=W_{m2}*\cos(\omega_o t + 135°)$ | $S4=W_{a2}*\cos(\omega_o t + 135°)$ |
| LSB | 1 | 0 | $S1=W_{m1}*\cos(\omega_o t + 180°)$ | S2=OFF |

| I LSB | Q LSB | Phase (degrees) | Power Amplifier W = 1 | Power Amplifier W = sqrt(2) - 1 |
|---|---|---|---|---|
| 0 | 0 | - | OFF | OFF |
| 1 | 0 | 0 | ON | OFF |
| 1 | 1 | 45 | ON | ON |
| 0 | 1 | 90 | ON | OFF |
| -1 | 1 | 135 | ON | ON |
| -1 | 0 | 180 | ON | OFF |
| -1 | -1 | 225 | ON | ON |
| 0 | -1 | 270 | ON | OFF |
| 1 | -1 | 315 | ON | ON |

DIGITAL RF TRANSMITTER OPTIMIZED FOR LINEAR QUANTIZED IQ UP CONVERSION

BACKGROUND

1. Field

The present invention relates generally to a high-efficiency digital transmitter. More particularly, the present invention relates to a digital radio-frequency (RF) transmitter that is optimized for linear quantized in phase and quadrature (IQ) up conversion.

2. Description of the Related Art

Digital power amplifiers can be designed for various quantization schemes. The preferred digital quantization scheme for digital power amplifiers is to quantize the power. In addition, the angle of the digital power amplifiers can be adjusted by controlling the phase angle of a radio frequency (RF) drive circuit to each digital power amplifier. The combination of the quantized power and the varied angle to each digital power amplifier maps nonlinearly to the linearly quantized in phase (I) and quadrature (Q) components of baseband signals. Increasing the quantization levels can achieve a reasonable approximation; however, the process is complicated and does not yield accurate results. Thus, it is difficult to implement a digital RF transmitter that is optimized for linear quantized IQ up conversion.

Thus, there is a need for a low cost high-efficiency digital RF transmitter that is optimized for linear quantized IQ up conversion.

SUMMARY

The present invention is directed to a low cost high-efficiency digital RF transmitter which uses digital power amplifiers and various mapping techniques to generate an output signal, which reproduces a baseband signal at a carrier frequency. The digital RF transmitter provides precise up conversion of in phase (I) and quadrature (Q) digital baseband signals. The digital RF transmitter includes a decoder for receiving the in phase (I) and quadrature (Q) digital baseband signals each of N bits of amplitude plus a sign bit, where N is the total number of bits for each signal, a phase generator for generating eight waveforms at a carrier or output frequency where each phase is a multiple of 45 degrees, a first set of main amplifiers of fixed output power, and a second set of auxiliary amplifiers of fixed output power such that the ratio of the voltage amplitudes at the outputs of the second set of auxiliary amplifiers to the voltage amplitudes at the outputs of the first set of main amplifiers is fixed at sqrt(2)−1. The digital RF transmitter may also include a set of multiplexers for selecting one of the eight carrier waveforms, or an off signal, to transmit to each of the first set of main amplifiers and the second set of auxiliary amplifiers based on both the in phase (I) digital baseband signal and the quadrature (Q) digital baseband signal. In general, the present invention utilizes multiple first digital amplifiers and multiple second auxiliary digital amplifiers to illustrate the structure and functions of the present invention.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

FIG. 2 is an exemplary table showing four bits representing the I digital baseband signal and four bits representing the Q digital baseband signal according to an embodiment of the present invention;

FIG. 3 is an exemplary table showing quadrants and possible phases for selection based on the sign bit of the I digital baseband signal and the Q digital baseband signal according to an embodiment of the present invention;

DETAILED DESCRIPTION

Reference will now be made in detail to the preferred embodiments of the invention which set forth the best modes contemplated to carry out the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, molding procedures have not been described in detail as not to unnecessarily obscure aspects of the present invention.

Figure 1:
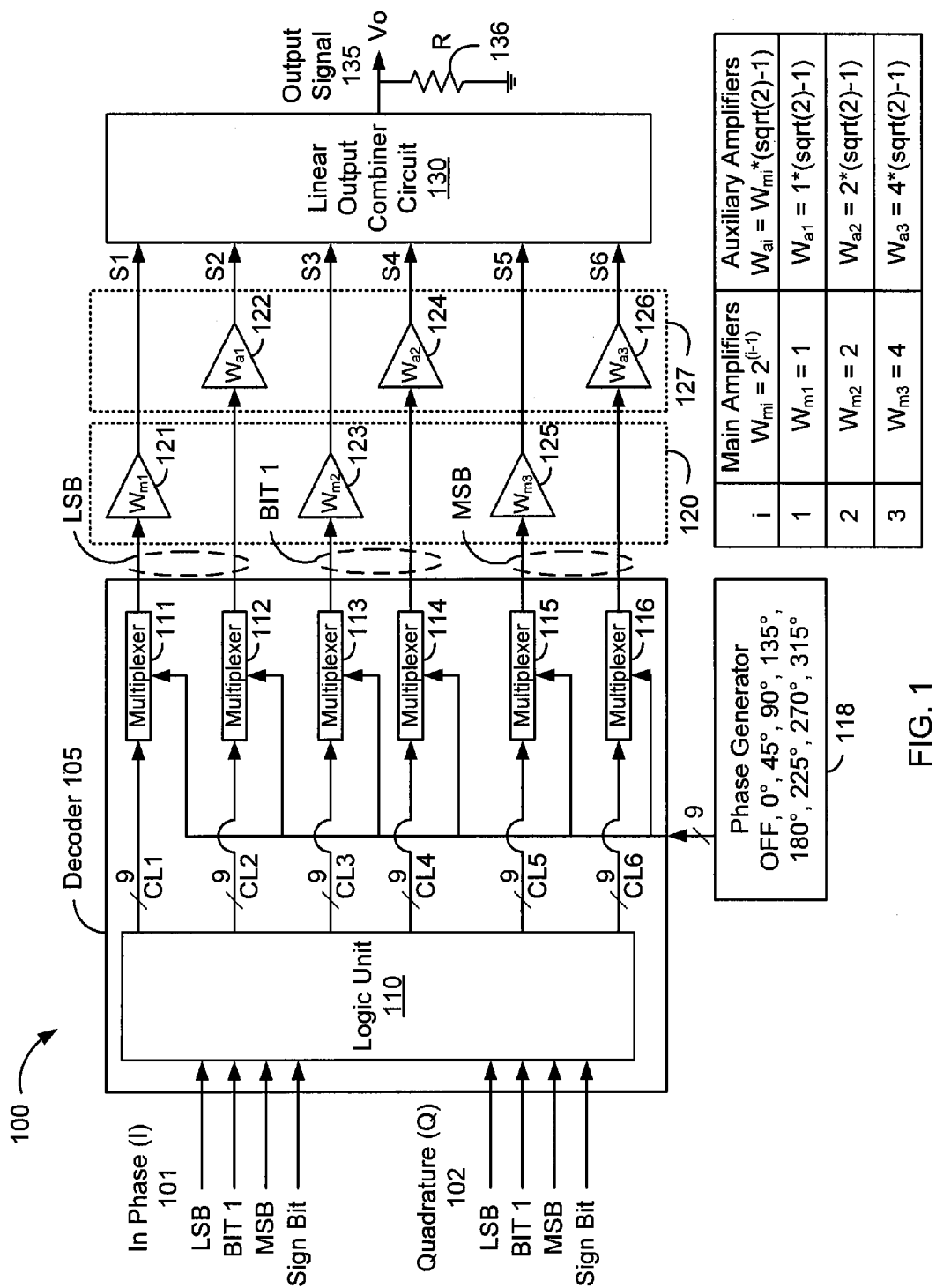
FIG. 1 is an exemplary schematic diagram of a digital RF transmitter according to an embodiment of the present invention.

FIG. 1 is an exemplary schematic diagram of a digital RF transmitter 100 according to an embodiment of the present invention. The digital RF transmitter 100 can include a decoder 105, a plurality of multiplexers 111-116, a phase generator 118, a plurality of digital power amplifiers 120 and 127, and a linear output combiner circuit 130. The transmitter 100 can be, for example, a transmitter in an electronic device, such as a mobile phone or a laptop computer. The transmitter 100 receives an input signal, for example, comprising I and Q components, and generates an output signal 135 at a carrier frequency. The output signal 135 can optionally be transmitted to a high power output unit and/or a lower power output unit. The high power output unit can be, for example, a front end module unit, and can include switches and an antenna. The low power output unit can be, for example, an external power amplifier. The external power amplifier can be, for example, a linear power amplifier.

The decoder 105 receives an in phase (I) quantized digital baseband signal 101 and a quadrature (Q) quantized digital baseband signal 102 from, for example, a baseband IQ signal generator. In the embodiments described herein, the rectangularly quantized in phase (I) and quadrature (Q) digital baseband signals 101 and 102 are described as an example. The input signal is, however, not limited to in phase (I) and quadrature (Q) baseband signals 101 and 102.

The decoder 105 processes the input bits from the corresponding I and Q digital baseband signals 101 and 102 in parallel. The decoder 105 processes the corresponding I bit and Q bit simultaneously without using information from other corresponding bits. For example, the most significant bit (MSB) of both the I input signal and the Q input signal are processed simultaneously. Similarly, the least significant bit (LSB) of both the I input signal and the Q input signal are processed simultaneously. This follows for the remaining bits. The decoder 105 can process multiple bits in parallel (at the same time) or in series from the corresponding I and Q digital baseband signals 101 and 102. As an example, the I bits and the Q bits are input in parallel into the logic unit 110.

FIG. 2 is an exemplary table 200 showing four bits representing the I digital baseband signal 101 and four bits representing the Q digital baseband signal 102 according to an embodiment of the present invention. As an example, the I digital baseband signal 101 has a value of −3 represented by a sign bit of 1, a MSB of 0, a Bit 1 of 1, and a LSB of 1. As an example, the Q digital baseband signal 102 has a value of +6 represented by a sign bit of 0, a MSB of 1, a Bit 1 of 1, and a LSB of 0. The table 200 shows example I bits and Q bits to illustrate the functions and operations of the digital RF transmitter 100. Even though four bits are illustrated for each of the digital baseband signals 101 and 102, one skilled in the art will appreciate that an arbitrary number of bits can be used when implementing the digital RF transmitter 100.

Referring to FIGS. 1 and 2, the decoder 105 includes a logic unit 110 (e.g., a mapping algorithm) to determine which of the plurality of digital power amplifiers 120 and 127 to turn on and off and which phase to select for each digital power amplifier of the plurality of digital power amplifiers 120 and 127. The logic unit 110, using FIG. 3, table 300 for example, selects a quadrant from column 301 and possible phases from column 302 based on the sign bit of the I digital baseband signal 101 and the sign bit of the Q digital baseband signal 102.

Using the example shown in FIG. 2, the sign bit of the I digital baseband signal 101 is 1 and the sign bit of the Q digital baseband signal 102 is 0. Therefore, using table 300, the logic unit 110 selects Quadrant II and possible phases of 90, 135, and 180 degrees. Next, the logic unit 110 determines which phase of the eight possible phases or off to select for each of the plurality of amplifiers 120 and 127 by selecting one of nine control lines to each of the plurality of multiplexers 111-116. Each control line corresponds to selecting one of the eight phases or off. Each of the plurality of amplifiers 120 and 127 is connected to one unique multiplexer of the plurality of multiplexers 111-116. In one embodiment, the nine control lines are configured to correspond to an OFF signal, and phase angles of 0, 45, 90, 135, 180, 225, 270, and 315 degrees, respectively. Hence, the sign bit of the I bit and the Q bit is used to select an OFF signal or the correct phase angle from the possible phases.

For example, in FIG. 2, since the I digital baseband signal 101 has a MSB equal to 0, and the I digital baseband sign bit is 1 corresponding to a negative number, and the Q digital baseband signal 102 has a MSB equal to 1, and the Q digital baseband sign bit is 0 corresponding to a positive number, the logic unit 110 sets one of the nine control lines of CL5 to 1 corresponding to 90 degrees of phase and the remaining control lines of CL5 are set to 0. The logic unit 110 also sets one of the nine control lines of CL6 corresponding to "off" to 1 and the remaining control lines of CL6 are set to 0. These assignments activate the main amplifier 125 assigned to the MSB with the 90 degree phase signal from the signal generator 118 and turn off the auxiliary amplifier 126 assigned to the MSB. The phase of 90 degrees corresponds to the I MSB equal to 0 and the Q MSB equal to 1 and the sign of the I digital data is negative which corresponds to Quadrant II.

Since the I digital baseband signal 101 has a Bit 1 equal to 1, and the I digital baseband sign bit is 1 corresponding to a negative number, and the Q digital baseband signal 102 has a Bit 1 equal to 1, and the Q digital baseband sign bit is 0 corresponding to a positive number, the logic unit 110 sets one of the nine control lines of CL3 to 1 corresponding to 135 degrees of phase and the remaining control lines of CL3 are set to 0. The logic unit 110 also sets one of the nine control lines of CL4 to 1 corresponding to 135 degrees of phase and the remaining control lines of CL4 are set to 0. These assignments activate both the main amplifier 123 and the auxiliary amplifier 124 with the 135 degree phase signal from the signal generator 118. The phase of 135 degrees corresponds to the I Bit 1 equal to 1 and the Q Bit 1 equal to 1 and the sign of the I digital data is negative which corresponds to Quadrant II. The auxiliary amplifier 124 is needed because the carrier signal amplitude needed for I digital baseband signal Bit 1 equal to 1 and Q digital baseband signal Bit 1 equal to 1 is larger by a factor of the sqrt(2) than for the case where either Bit 1 is equal to 0. The extra amplitude needed is provided by the auxiliary amplifier 124 and the extra amplitude provided is equal to 2 times sqrt(2)−1. The auxiliary amplifier 124 amplitude is summed with the main amplifier 123 amplitude of 2 to provide an amplitude of 2 plus 2 times sqrt(2)−1 or a total amplitude of 2 times sqrt(2).

Since the I digital baseband signal 101 has a LSB equal to 1, and the I digital baseband sign bit is 1 corresponding to a negative number, and the Q digital baseband signal 102 has a LSB equal to 0, and the Q digital baseband sign bit is 0 corresponding to a positive number, the logic unit 110 sets one of the nine control lines of CL1 to 1 corresponding to 180 degrees of phase and the remaining control lines of CL1 are set to 0. The logic unit 110 also sets one of the nine control lines of CL2 corresponding to "off" to 1 and the remaining control lines of CL2 are set to 0. These assignments activate the main amplifier 121 assigned to the LSB with the 180 degree phase signal from the signal generator 118 and turn off the auxiliary amplifier 122 assigned to the LSB. The phase of 180 degrees corresponds to the I LSB equal to 1 and the Q LSB equal to 0 and the sign of the I digital data is negative which corresponds to Quadrant II.

Power consumption for the RF transmitter 100 is reduced when one or more of the digital power amplifiers are turned off Once the logic unit 110 determines which control line to set for each set of control lines, the logic unit 110 simultaneously transmits a 0 or 1 along each control line. Each set of control lines is connected to a corresponding multiplexer.

Referring to FIG. 1, the phase generator 118 generates, as an example, eight different waveforms at a carrier frequency having different phases where each phase is a multiple of 45 degrees. The present invention is not limited to eight different phases and is not limited to a spacing being a multiple of 45 degrees. The phase generator 118 can also have or generate an off signal that is sent to the multiplexers 111-116. Hence, the phase generator 118 outputs the eight different waveforms and an off signal to each of the plurality of multiplexers 111-116. The phase generator 118 can also be referred to as a signal generator or a waveform generator.

The waveforms can be generated using the equation cos $(\omega_0 t + \theta)$, where $\omega_0$ is the carrier frequency and $\theta$ is the phase. As described herein, the different phases ($\theta$), as an example, include 0, 45, 90, 135, 180, 225, 270, and 315 degrees. The multiple waveforms are sent to each of the plurality of multiplexers 111-116 and are used to drive the plurality of digital power amplifiers 120 and 127. Based on the selected control line received from the logic unit 110, each multiplexer is able to propagate the specific waveform to drive each of the plurality of digital power amplifiers 120 and 127. In one embodiment, the possible phase angles are an integer division of 360 degrees (i.e., satisfy the equation angle=360/M where M is an integer). The specific case of M equal to 8 results in an angle of 45 degrees, thus, the set of phase angles are 0, 45, 90, 135, 180, 225, 270, and 315 degrees. These eight phases and the "off" signal are the nine possible inputs to each of the plurality of digital power amplifiers 120 and 127. The specific case of M equal to 8 maps the I and Q digital baseband signals 101 and 102 to the rectangular coordinates of the output signal 135.

The multiplexers 111-116 include circuitry (e.g., switches, transistors, etc.) that are controlled by the control signals from the logic unit 110. For the example described in FIG. 1, these control signals are CL1-CL6. The multiplexers 111-116 receive the control signals from the logic unit 110 and based on these control signals, select the appropriate waveform that is input to the multiplexers 111-116 from the phase generator 118. The output of each multiplexer is connected to the input of one of the plurality of digital power amplifiers 121-126. Based on the control signals received from the logic unit 110, each multiplexer can select an output signal that is either "off" or a carrier signal with a phase angle of one of 0, 45, 90, 135, 180, 225, 270 or 315 degrees.

The plurality of main digital power amplifiers 120 are weighted by $W_{mi}=2^{(i-1)}$ where $i \geq 1$ such that $W_{mi}=1, 2, 4$, etc. for i=1, 2, 3, etc., and the plurality of auxiliary digital power amplifiers 127 are weighted by $W_{ai}=W_{mi}*(sqrt(2)-1)$, where $i \geq 1$ such that $W_{ai}=1*(sqrt(2)-1), 2*(sqrt(2)-1), 4*(sqrt(2)-1)$, etc. for i=1, 2, 3, etc. As an example, the weighting of the first main digital power amplifier 121 is 1 and the weighting of the first auxiliary digital power amplifier 122 is 1*(sqrt(2)-1). The weighting of the first auxiliary digital power amplifier 122 is, however, not limited to 1*(sqrt(2)-1). The plurality of auxiliary digital power amplifiers 127 are used to reduce quantization errors.

Each of the plurality of digital power amplifiers 121-126 receives an input signal which is the output of one of the multiplexers 111-116. Each signal is either "off" or a carrier frequency having a phase of one of 0, 45, 90, 135, 180, 225, 270 or 315 degrees. The output signal of each digital power amplifier has a phase determined by the input signal and an amplitude determined by the weighting or gain of each of the plurality of digital power amplifiers 121-126. Hence, each of the plurality of digital power amplifiers 121-126 has a predetermined weight, which determines a magnitude of the output signal.

The linear output combiner circuit 130 combines the outputs of the plurality of digital power amplifiers 121-126 to generate the output signal 135 at the carrier frequency. The linear output combiner circuit 130 may provide additional weighting to the outputs of the plurality of digital power amplifiers 121-126. The output of the linear output combiner circuit 130 is the voltage 135 measured at the load resistor 136.

Figures 4, 5:
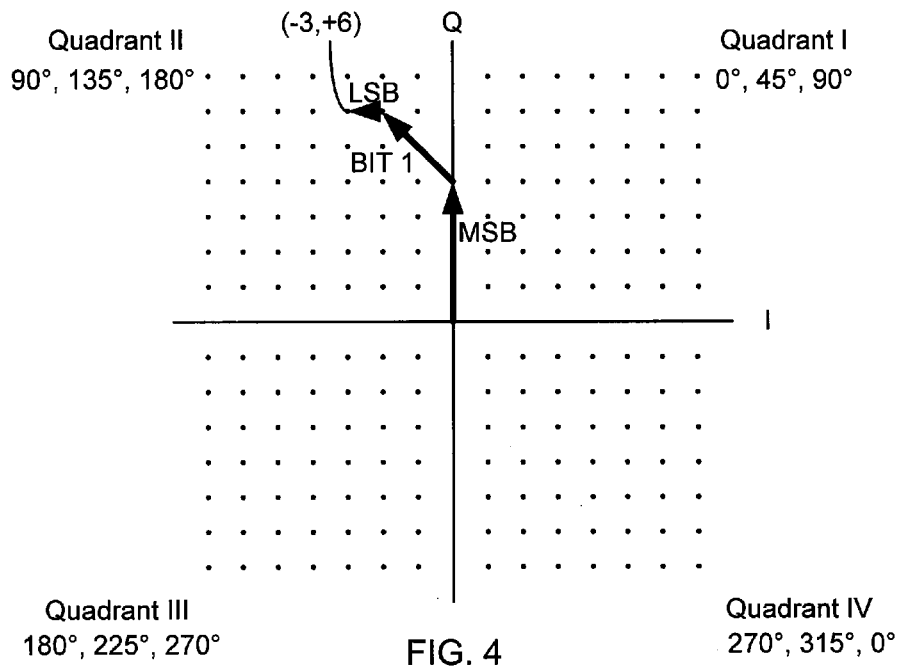
FIG. 4 shows an exemplary graph of the mapping of the I bits and the Q bits to the signals S1-S6 at the input to the combiner according to an embodiment of the present invention.
FIG. 5 shows exemplary waveforms transmitted to each of the plurality of first main amplifiers and second auxiliary amplifiers using the I bits and the Q bits for the particular example shown in FIG. 4 according to an embodiment of the present invention.

FIG. 5 shows a graph of the mapping of the I and Q digital baseband signals using the mapping algorithm along with the combined output signal 135 showing the mapping according to an embodiment of the present invention. The voltage 135 measured at the load resistor 136 exactly replicates the baseband signals 101 and 102 at the carrier frequency.

Figures 6, 7:
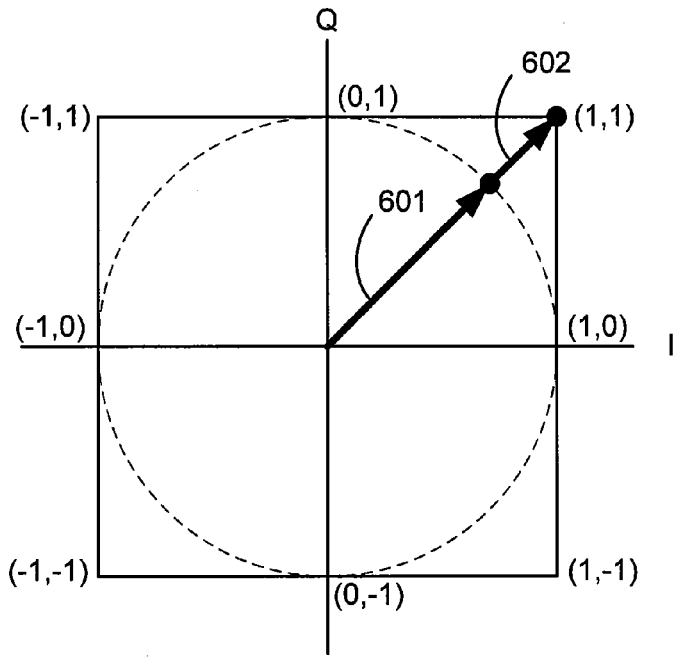
FIG. 6 shows a plot of one representative I digital data bit and Q digital data bit according to an embodiment of the present invention.
FIG. 7 is an exemplary table showing the possible combinations of the I LSB and sign bit and the Q LSB and sign bit and the effects on the signals sent to the digital amplifiers 121 and 122 according to an embodiment of the present invention.
Figure 8:
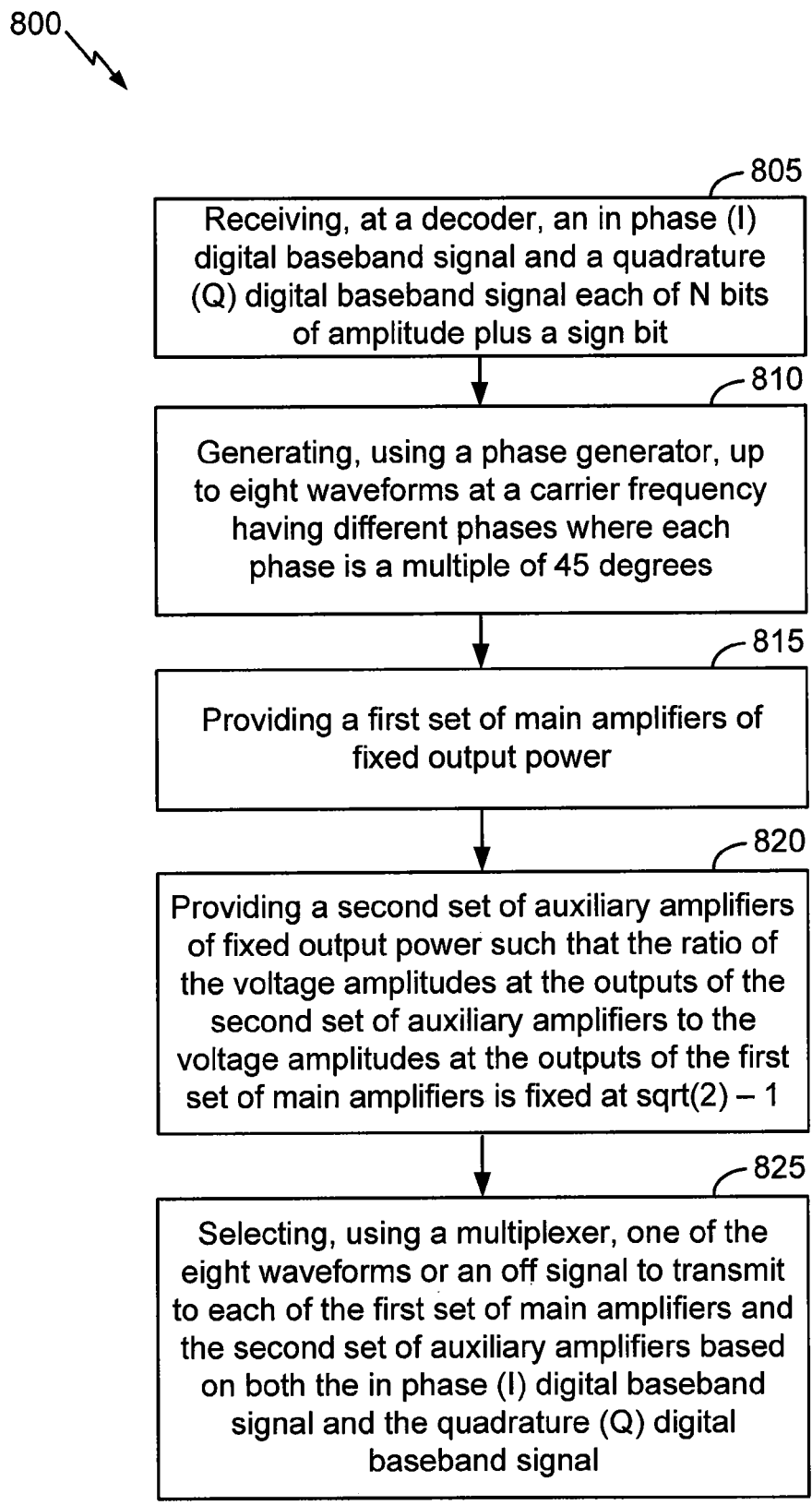
FIG. 8 is a flow chart for converting the corresponding bit from the I digital baseband signal and the Q digital baseband signal and this process is followed for all of the corresponding bits from the I digital baseband signal and the Q digital baseband signal except for the sign bits according to an embodiment of the present invention.

FIG. 6 shows a plot of one representative I digital data bit and Q digital data bit according to an embodiment of the present invention. For this example, the representative bit is the LSB of both the I digital data and the Q digital data, the digital power amplifiers 121 and 122 in FIG. 1. The sign bit for the data is included. This plot illustrates both the weighting and the phase for the LSB bit combinations. The possible combinations of the LSB bit and the sign are shown in FIG. 7. The example shows an I LSB bit of 1 and a Q LSB bit of 1. The phase needed for this combination is 45 degrees as shown by line 3 in FIG. 7. The output amplitude provided by the LSB amplifier 121 is represented by the vector 601 which has a weighting of 1. The additional amplitude needed to create the correct output amplitude is provided by amplifier 122 which has a weighting of sqrt(2)-1 and is represented by the vector 602. The plurality of auxiliary digital power amplifiers 127 are used to reduce the quantization error when the phase is 45, 135, 225, and 315 degrees. In these cases, the amplitude of the output signal must be increased to reduce the quantization error.

Those of ordinary skill would appreciate that the various illustrative logical blocks, modules, and algorithm steps described in connection with the examples disclosed herein may be implemented as electronic hardware, computer software, or combinations of both. Furthermore, the present invention can also be embodied on a machine readable medium causing a processor or computer to perform or execute certain functions.

To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed apparatus and methods.

The various illustrative logical blocks, units, modules, and circuits described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the examples disclosed herein may be embodied directly in hardware, in a software module executed by a processor, or in a combination of the two. The steps of the method or algorithm may also be performed in an alternate order from those provided in the examples. A software module may reside in random access memory (RAM), flash memory, read-only memory (ROM), erasable programmable read-only memory (EPROM), electronically erasable programmable read-only memory (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a wireless modem. In the alternative, the processor and the storage medium may reside as discrete components in the wireless modem.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A digital RF transmitter comprising:
    a decoder for receiving an in phase (I) digital baseband signal and a quadrature (Q) digital baseband signal each of N bits of amplitude plus a sign bit, where N an integer;
    a phase generator for generating eight waveforms at a carrier or output frequency where each phase is a multiple of 45 degrees;
    a first set of main amplifiers of fixed output power; and
    a second set of auxiliary amplifiers of fixed output power such that the ratio of voltage amplitudes at outputs of the second set of auxiliary amplifiers to voltage amplitudes at the outputs of the first set of main amplifiers is fixed at sqrt(2)−1.

2. The digital RF transmitter of claim 1 wherein the second set of auxiliary amplifiers has a weighting that is different from the first set of main amplifiers.

3. The digital RF transmitter of claim 1 wherein the second set of auxiliary amplifiers has a weighting less than the first set of main amplifiers.

4. The digital RF transmitter of claim 1 wherein the first set of main amplifiers each has a weighting of $2^{(i-1)}$ and the second set of auxiliary amplifiers each has a weighting of $2^{(i-1)}*(\text{sqrt}(2)-1)$, where i>1.

5. The digital RF transmitter of claim 1 further comprising a multiplexer for selecting one of the eight carrier waveforms, or an off signal, to transmit to each of the first set of main amplifiers and the second set of auxiliary amplifiers based on both the in phase (I) digital baseband signal and the quadrature (Q) digital baseband signal.

6. The digital RF transmitter of claim 1 further comprising a linear output combiner circuit for combining the outputs of the first set of main amplifiers and the second set of auxiliary amplifiers to generate an output signal at the carrier or output frequency.

7. A digital RF transmitter comprising:
    means for generating a plurality of waveforms at a carrier frequency each of the plurality of waveforms having a different phase;
    a first set of main amplifiers and a second set of auxiliary amplifiers where the second set of auxiliary amplifiers are used to reduce a quantization error; and
    means for selecting one of the plurality of waveforms or an off signal to transmit to the first set of main amplifiers and the second set of auxiliary amplifiers,
    wherein the first set of main amplifiers each has a weighting of $2^{(i-1)}$ and the second set of auxiliary amplifiers each has a weighting of $2^{(i-1)}*(\text{sqrt}(2)-1)$, where i≧1.

8. The digital RF transmitter of claim 7 wherein the second set of auxiliary amplifiers has a weighting that is different from the first set of main amplifiers.

9. The digital RF transmitter of claim 7 wherein the second set of auxiliary amplifiers has a weighting that is less than a weighting of the first set of main amplifiers.

10. The digital RF transmitter of claim 7 wherein each phase is a multiple of 45 degrees.

11. A digital RF transmitter for rectangular quantization of in phase (I) and quadrature (Q) baseband signals, the digital RF transmitter comprising:
    a logic unit for receiving the in phase (I) and quadrature (Q) baseband signals;
    a phase generator for generating eight waveforms at a carrier frequency having different phases where each phase is a multiple of 45 degrees;
    a first set of main amplifiers of fixed output power; and
    a second set of auxiliary amplifiers of fixed output power such that the ratio of voltage amplitudes at outputs of the second set of auxiliary amplifiers to voltage amplitudes at the outputs of the first set of main amplifiers is fixed at sqrt(2)−1.

12. The digital RF transmitter of claim 11 further comprising a decoder for selecting one of the eight waveforms or an off signal to transmit to the first set of main amplifiers and the second set of auxiliary amplifiers based on the in phase (I) and quadrature (Q) baseband signals.

13. A method for rectangular quantization of baseband signals, the method comprising:
    generating, using a phase generator, a plurality of waveforms at a carrier frequency each of the plurality of waveforms having a different phase;
    amplifying, using a first set of main amplifiers, at least one of the plurality of waveforms;
    reducing, using a second set of auxiliary amplifiers, a quantization error; and
    selecting, using a decoder, one of the plurality of waveforms or an off signal to transmit to the first set of main amplifiers and the second set of auxiliary amplifiers,
    wherein the first set of main amplifiers each has a weighting of $2^{(i-1)}$ and the second set of auxiliary amplifiers each has a weighting of $2^{(i-1)}*(\text{sqrt}(2)-1)$, where i≧1.

14. The method of claim 13 wherein the second set of auxiliary amplifiers has a weighting that is different from the first set of main amplifiers.

15. The method of claim 13 wherein the second set of auxiliary amplifiers has a weighting that is less than a weighting of the first set of main amplifiers.

16. The method of claim 13 wherein each phase is a multiple of 45 degrees.

* * * * *